(12) United States Patent
Satoh

(10) Patent No.: US 6,834,283 B1
(45) Date of Patent: Dec. 21, 2004

(54) DATA COMPRESSION/DECOMPRESSION APPARATUS USING ADDITIONAL CODE AND METHOD THEREOF

(75) Inventor: Noriko Satoh, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/457,597

(22) Filed: Dec. 9, 1999

(30) Foreign Application Priority Data

Jan. 7, 1999 (JP) .......................................... 11-002129

(51) Int. Cl.[7] .............................................. G06F 17/30
(52) U.S. Cl. ................................ 707/101; 704/3; 704/7
(58) Field of Search ........................... 707/101; 341/50, 341/51, 87, 67, 79, 65, 106, 107; 704/3, 7, 10

(56) References Cited

U.S. PATENT DOCUMENTS

| | | | | |
|---|---|---|---|---|
| 5,254,990 A | * | 10/1993 | Yoshida et al. ............... | 341/51 |
| 5,604,495 A | * | 2/1997 | Watanabe .................... | 341/51 |
| 5,673,042 A | * | 9/1997 | Yoshida et al. ............... | 341/51 |
| 5,717,393 A | * | 2/1998 | Nakano et al. ............... | 341/50 |
| 5,737,733 A | * | 4/1998 | Eller .............................. | 707/3 |
| 5,801,648 A | * | 9/1998 | Satoh et al. .................. | 341/50 |
| 5,825,315 A | * | 10/1998 | Murashita et al. .......... | 341/106 |
| 5,841,376 A | * | 11/1998 | Hayashi ....................... | 341/51 |
| 5,907,637 A | * | 5/1999 | Murashita et al. .......... | 382/239 |
| 6,489,902 B2 | * | 12/2002 | Heath .......................... | 341/87 |
| 6,529,912 B2 | * | 3/2003 | Satoh et al. ................ | 707/101 |
| 6,542,640 B1 | * | 4/2003 | Morihara et al. ........... | 382/229 |
| 2003/0091241 A1 | * | 5/2003 | Morihara et al. ........... | 382/233 |

FOREIGN PATENT DOCUMENTS

| | | |
|---|---|---|
| JP | 60-241157 | 11/1985 |
| JP | 62-68325 | 3/1987 |

* cited by examiner

*Primary Examiner*—Jean R. Homere
*Assistant Examiner*—Leslie Wong
(74) *Attorney, Agent, or Firm*—Staas & Halsey LLP

(57) ABSTRACT

Words and word codes corresponding to the words are registered in advance. If an unregistered word appears when data are compressed, the code of the leading character of the word is divided into a plurality of parts in a specific size, a predetermined additional code is added to generate a code of the same length as the word code. Thus, the compressed data can be treated as fixed length codes. When the compressed data are decompressed, the code of an unregistered character is identified using this additional code.

16 Claims, 20 Drawing Sheets

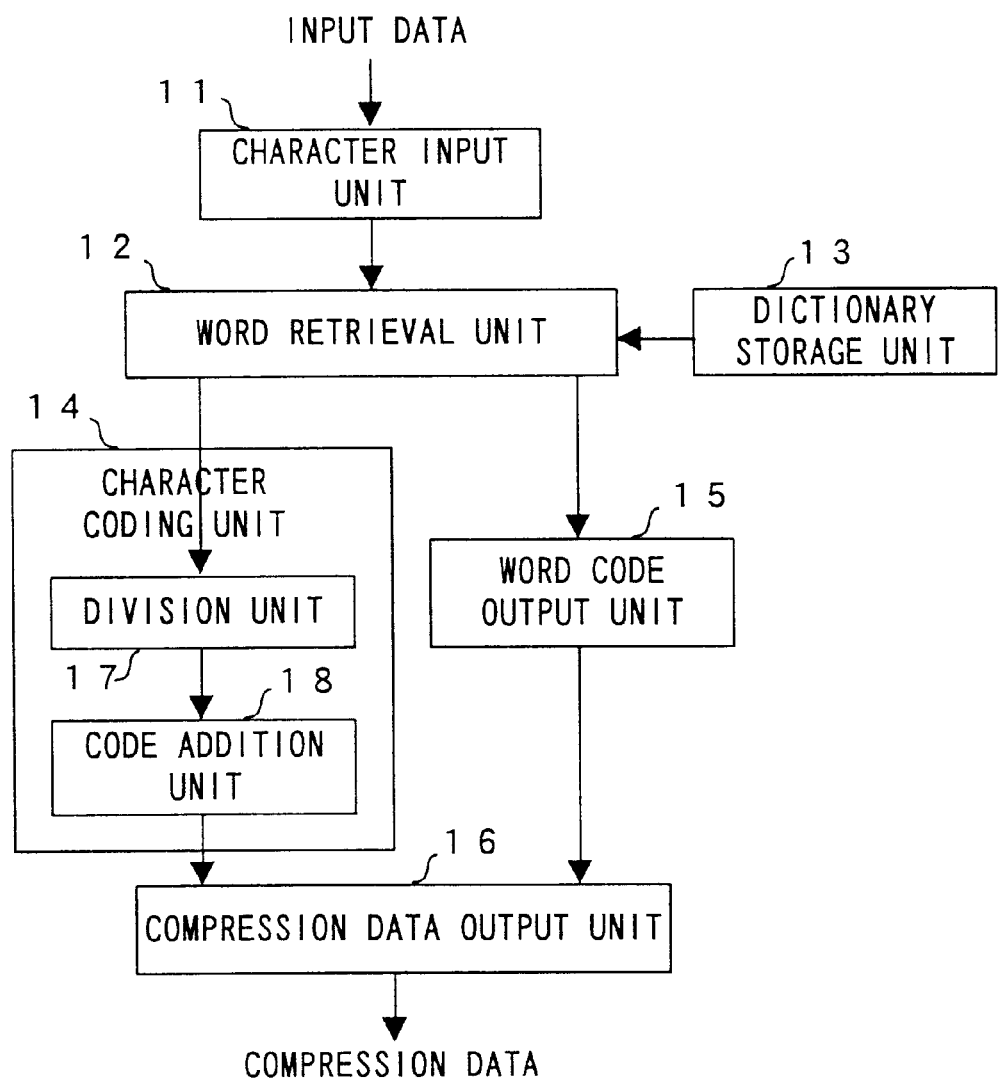
F I G. 3 A

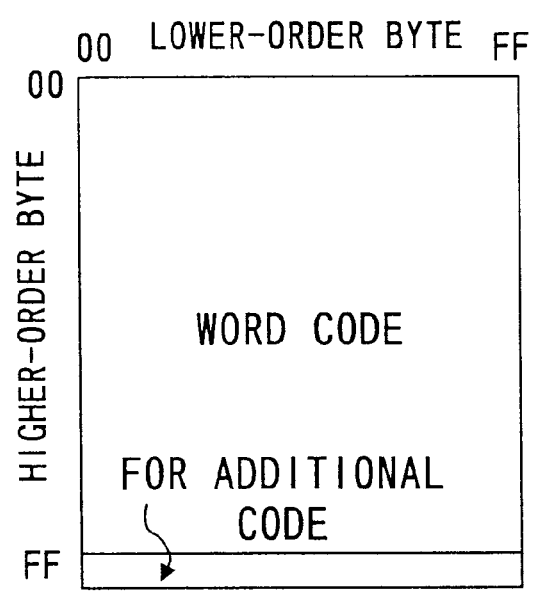
F I G. 4

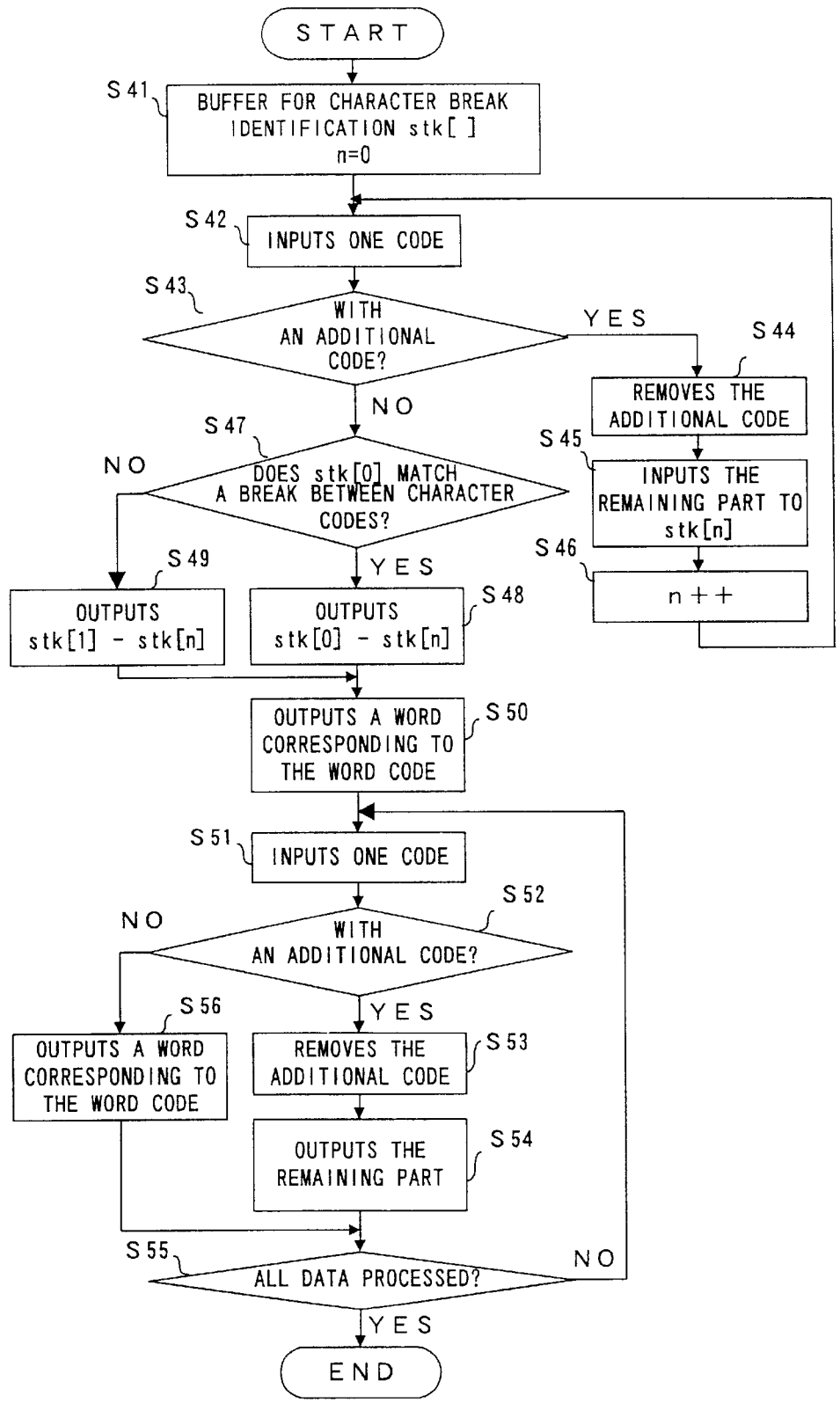
F I G. 1 2

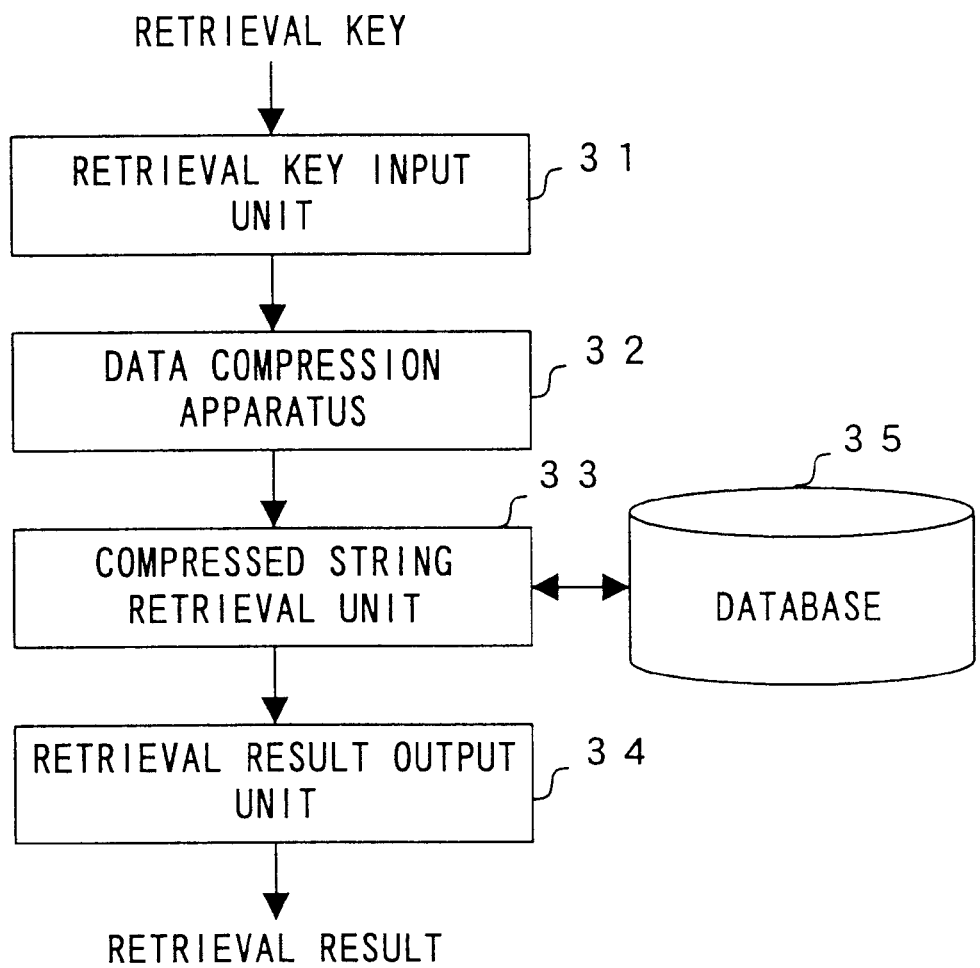
F I G. 1 5

DATA COMPRESSION/DECOMPRESSION APPARATUS USING ADDITIONAL CODE AND METHOD THEREOF

BACKGROUND OF THE INVENTION

1. Field of the Invention

The present invention relates to a data compression/decompression technology based on a code table in which codes of one or more bit sizes having a specific meaning, such as document data, CAD (computer aided design) data, program codes, etc., are described.

2. Description of the Related Art

Lately, as a variety of data, such as document data, CAD data, etc., have been handled by a computer, the amount of data to be handled has increased. When such a large amount of data are handled, the storage capacity can be reduced and high-speed transmission to a distant destination can be realized by removing data redundancy and compressing the data.

For example, a method for converting an input character string to a shorter word code using a dictionary having words and corresponding word codes is used as one compression method targeting document data. According to this method, words and corresponding word codes must be prepared in advance. In this case, since, generally speaking, the number of words is large, and special words, such as proper nouns are also included, word codes cannot be assigned in advance to all the words of input data. Under these circumstances, roughly speaking, the following two methods are proposed to handle words to which word codes cannot be assigned in advance.

According to the first method, output codes are assigned to all characters and idle codes are assigned to words. For example, in Japanese code, such as JIS (Japanese Industrial Standard) code, etc., since only a part of the codes out of all available two-byte codes are used for characters of kana, kanji, etc., the remaining idle codes can be assigned to words.

FIG. 1A shows character code areas in the code space of such a two-byte code. This code space corresponds to a two-dimensional space whose first coordinate represents numbers 0x00 to 0xFF in the hexadecimal notation indicated by the higher-order byte of a two-byte code and whose second coordinate represents numbers 0x00 to 0xFF indicated by the lower-order byte. In this example, an area in which the higher-order byte and lower-order byte both are 0x21 to 0x7E is used for character codes, and idle codes in other areas are used as word codes for words.

According to the second method, a switching code is inserted between an unconverted code and a converted word code obtained as a result of compression, and the same code as input data and a word code are distinguished from each other. According to this method, unconverted original code can be overlapped with a word code, and it can be judged whether the next code is a word code or an original code, by detecting the switching code inserted in the compression result.

FIG. 1B shows a case in which the code space of the above-described two-byte code is used for a word code. In this example, all codes except "0xFFFF" are used as word codes, and "0xFFFF" is used as a switching code. This switching code is inserted in the compression result, for example, as shown in FIG. 1C.

Out of the codes of an input character string "圧縮するCADデータ" shown in FIG. 1C, "0x88b38f6b" corresponding to "圧縮" is converted to a word code "0x8260", "0x82b782e9" corresponding to "する" is converted to a word code "0x0011", and "0x8366815b835e" corresponding to "データ" is converted to a word code "0x8261". Then, "0x826282608263" corresponding to "CAD" is left unconverted, and a switching code "0xFFFF" is inserted after and before the code.

However, the conventional data compression method described above has the following problems.

According to the method in which all characters are registered in advance, if the number of characters to be registered is large, the number of words to be registered is restricted, and only a few words can be replaced with word codes. Therefore, data cannot be compressed much. For example, if Unicode covering all major characters in the world is used, a substantial part of the code space shown in FIG. 1A is assigned to characters, and only a few idle codes can be used for words. When a user registers an external character, the same problem occurs.

However, according to the method in which a switching code is inserted, if a switching code appears when compression data are decompressed, codes following the switching code are regarded as another kind of codes. For example, if "0xFFFF" appears following a word code "0x0011" in the compression data shown in FIG. 1C, the subsequent codes are recognized as uncompressed original codes. In this case, if "0xFFFF" appears following a code "0x8263", the subsequent codes are recognized as word codes again.

Since in this way, the meaning of codes after and before a switching code varies depending on the position of the switching code, compression data must always be decompressed from the beginning and cannot be decompressed in the mid-course.

SUMMARY OF THE INVENTION

An objective of the present invention is to provide a data compression/decompression apparatus for compressing data represented by predetermined codes at a high compression rate and decompressing the compression data from an arbitrary position of the compression data and a method thereof.

In the first aspect of the present invention, the data compression apparatus comprises a code input unit, a dictionary unit, a registration code output unit and a coding unit, and compresses data including codes of one or more sizes.

The code input unit inputs data in units of codes, and the dictionary unit stores a code string consisting of one or more codes and a registration code corresponding to the code string. If the input code string is stored in the dictionary unit, the registration code output unit outputs a registration code corresponding to the input code string. If the input code string is not stored in the dictionary unit, the coding unit generates a new code by adding an additional code to an input code in the input code string and outputs the new code.

In the second aspect of the present invention, the data compression apparatus comprises a code input unit, a dictionary unit, a registration code output unit and a coding unit, and compresses data including codes of one or more sizes.

The code input unit inputs data in units of codes, and the dictionary unit stores a code string consisting of one or more codes and a registration code corresponding to the code string. If the input code string is stored in the dictionary unit, the registration code output unit outputs a registration code corresponding to the input code string. If the input code string is not stored in the dictionary unit, the coding unit generates a new code by dividing an input code in the input code string and outputs the new code.

In the third aspect of the present invention, the data decompression apparatus comprises a dictionary unit, a unit input unit, an identification unit, a removal unit and a code string decompression unit, and decompresses compression data obtained by compressing original data including codes of one or more sizes to the original data.

The unit input unit inputs data in a specific unit, and the dictionary unit stores a code string consisting of one or more codes and a registration code corresponding to the code string. The identification unit judges whether a part of input data is a predetermined additional code. If a part of the input data is the predetermined additional code, the removal unit generates new data by removing the additional code from the input data and outputs the generated data. If a part of the input data is not an additional code, the code decompression unit regards the input data as a registration code and outputs a code string corresponding to the input data.

In the fourth aspect of the present invention, a retrieval apparatus comprises an input unit, a compression unit, a retrieval unit and an output unit.

The input unit inputs a retrieval key, and the compression unit compresses the inputted retrieval key. The retrieval unit retrieves the compressed retrieval key in the compression data, and the output unit outputs a retrieval result.

BRIEF DESCRIPTION OF THE DRAWINGS

FIG. 3A shows the configuration of the data compression apparatus.

FIG. 4 shows how to use an additional code.

FIG. 12 is a flowchart showing the second process.

FIG. 15 shows the configuration of the retrieval apparatus.

DESCRIPTION OF THE PREFERRED EMBODIMENTS

The details of the preferred embodiments of the present invention is described below with reference to the drawings.

Figure 2:
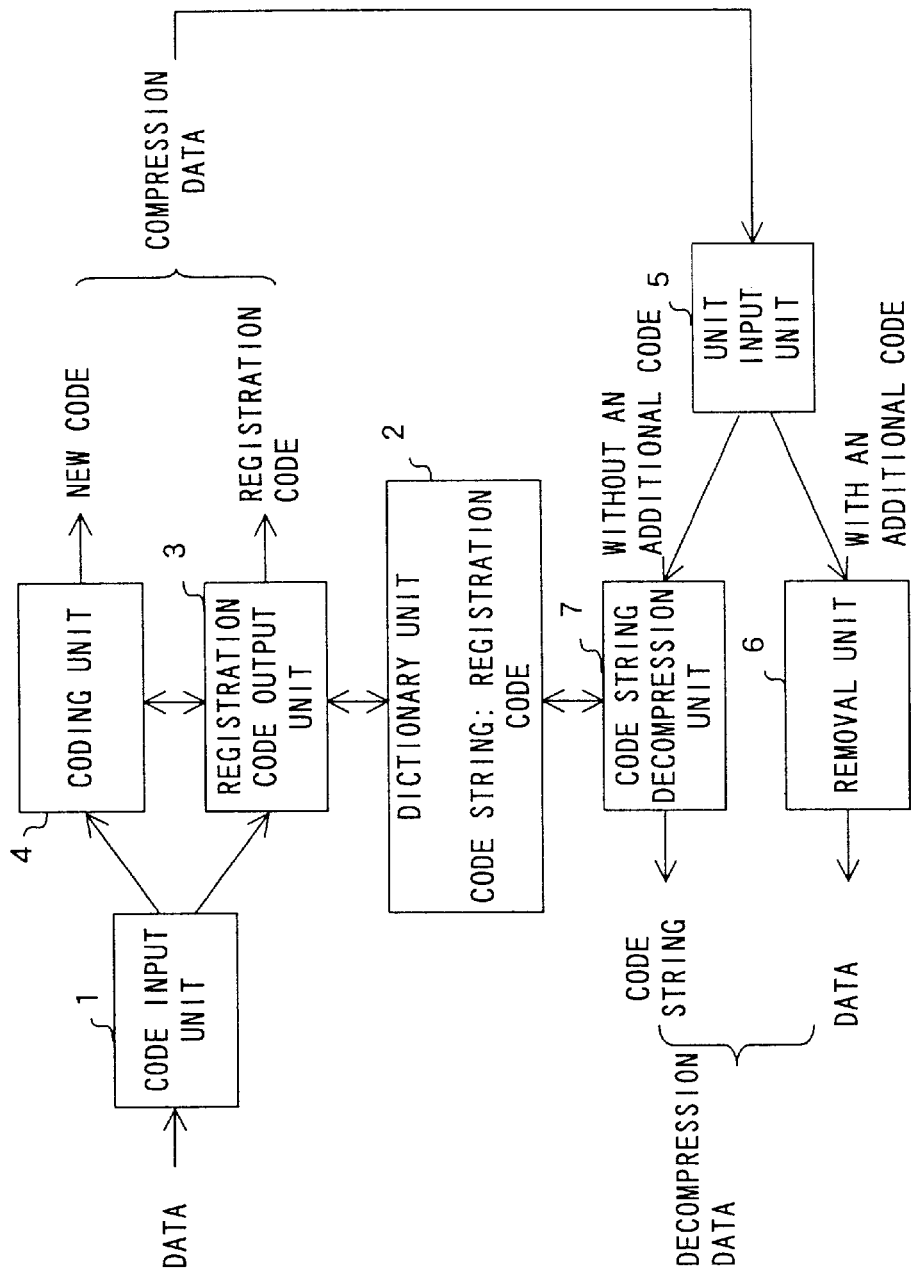
FIG. 2 shows the principle of the data compression/decompression apparatus of the present invention.

FIG. 2 shows the principle of the data compression/decompression apparatus of the present invention.

The data compression apparatus shown in FIG. 2 comprises a code input unit 1, a dictionary unit 2, a registration code output unit 3 and a coding unit 4, and compresses data including codes of one or more sizes.

The code input unit 1 inputs data in units of codes, and the dictionary unit 2 stores a code string consisting of one and more codes and a registration code corresponding to the code string. If the input code string is stored in the dictionary unit 2, the registration code output unit 3 outputs a registration code corresponding to the input code string. If the input code string is not stored in the dictionary unit 2, the coding unit 4 generates a new code by adding an additional code to an input code in the input code string.

According to such a configuration, the code input unit 1 inputs given data to be processed one code at a time, and if a registration code corresponding to an input code string is registered in the dictionary unit 2, the registration code output unit 3 outputs the registration code as a compression result. If a code string beginning from an input code is not registered in the dictionary unit 2, the coding unit 4 adds a predetermined additional code in the appropriate position of the input code and outputs a new code including the additional code as a compression result.

Since the compression result of input code not registered in the dictionary unit 2 can be dynamically generated by providing a coding unit, there is no need to register in advance all single codes to be compressed. Therefore, many registration codes to be assigned to code strings can be secured regardless of the kind of a code table to be used, enabling the improvement of the compression rate.

Whether a code included in compression data is a registration code can be easily judged without a switching code by using an additional code. Therefore, the compression data can be decompressed in the mid-course without tracing the compression data from the top.

The data decompression apparatus shown in FIG. 2 comprises a dictionary unit 2, a unit input unit 5, a removal unit 6 and a code string decompression unit 7, and decompresses compression data obtained by compressing original data including codes of one or more sizes to the original data.

The unit input unit 5 inputs data in a specific unit, and the dictionary unit 2 stores a code string consisting of one or more codes and a registration code corresponding to the code string. If a part of input data is a predetermined additional code, the removal unit 6 generates new data by removing the additional code from the input data and outputs the generated data. If a part of input data is not an additional code, the code string decompression unit 7 regards the input data as a registration code and outputs a code string corresponding to the input data.

According to such a configuration, the unit input unit 5 inputs given data to be processed in a specific unit, and if the specific part of input data is an additional code, the removal unit 6 removes the additional code from the input data and outputs the remaining data as a decompression result. If the specific part of input data is not an additional code, the code string decompression unit 7 regards the input data as a registration code registered in the dictionary unit 7, acquires a code string corresponding to the input data and outputs the code string as a decompression result.

Since input data not registered in the dictionary unit 2 can be restored to original data by providing the removal unit 6, there is no need to register in advance all single codes to be compressed. Therefore, many registration codes to be assigned to code strings can be secured regardless of the kind of a code table to be used, enabling the improvement of the compression rate.

Whether a code included in compression data is a registration code can be easily judged without a switching code by using an additional code. Therefore, the compression data can be decompressed in the mid-course without tracing the compression data from the top.

For example, the input unit 1, dictionary unit 2, registration code output unit 3 and coding unit 4 shown in FIG. 2 correspond to the character input unit 11, dictionary storage unit 13, word code output unit 15 and character coding unit 14 shown in FIG. 3A described later, respectively, and the unit input unit 5, removal unit 6 and code string decompression unit 7 shown in FIG. 2 correspond to the specific unit input unit 21, additional code removal unit 23 and word decompression unit 24 shown in FIG. 3B described later, respectively.

For example, a code inputted by the code input unit 1 corresponds to a character inputted by the character input unit 11, and the code string and registration code stored in the dictionary unit 2 correspond to the word and word code stored in the dictionary storage unit 13, respectively.

The present invention can be applied to the compression/decompression of data generated from a code table in which there are codes of one or more bit sizes having a specific meaning, such as document data. Hereinafter, one unit of information registered in a code table is called a code or character. For example, in the case of SJIS (Shift-JIS) code, characters, such as a control code, alphabet, etc., are represented using a bit size of one byte, and characters, such as kanji, hiragana, etc., are represented using a bit size of two bytes.

A character string consisting of one or more characters of an arbitrary language including Japanese and English is called a word in the following description. Here, not only an ordinary word, such as one noun or verb, but also an arbitrary character string including a complex combination of a plurality of words are handled as a word.

In this preferred embodiment, a plurality of words and word codes corresponding the words are stored as a dictionary. If a word not registered in the dictionary appears when data are compressed, the code of the leading character of the word is divided into a specific size, a predetermined additional code is added and a code of the same length as the word code is generated. The code of an unregistered character generated in such a way should not overlap with a word code assigned to a registered word.

Figure 1A:
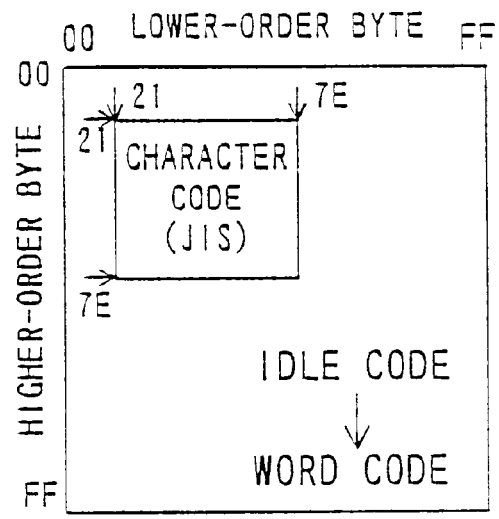
FIG. 1A is a memory diagram showing how to assign an idle code to a word according to the prior art.
Figure 1B:
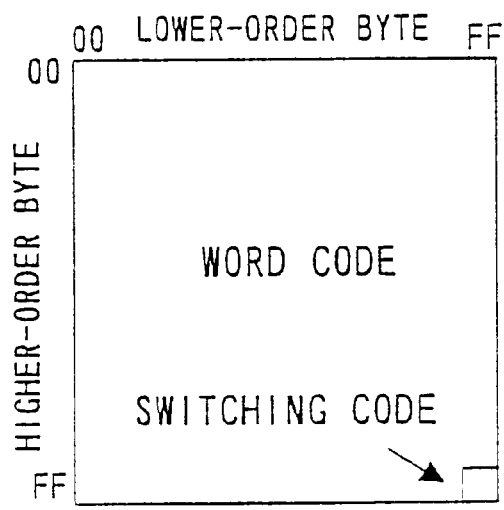
FIG. 1B is a memory diagram showing how to insert a switching code according to the prior art.

For example, if data are divided in units of one byte, 256 codes, each of which can be represented using one byte, can be used to output unregistered characters. According to this method, since a code can be dynamically assigned to unregistered characters, there is no need to register all characters in advance, as shown in FIG. 1A. Therefore, many idle codes to be assigned to registered words can be secured regardless of the kind of a code table to be used, enabling the improvement of the compression rate.

The lengths of codes included in compression data can be unified by using an additional code, and it can be easily judged whether a code is a word code or the code of an unregistered character, without a switching code. Therefore, compression data can be decompressed in the mid-course without tracing the compression data from the top.

FIG. 3A shows the configuration of the data compression apparatus. The data compression apparatus shown in FIG. 3A comprises a character input unit 11, a word retrieval unit 12, a dictionary storage unit 13, a character coding unit 14, a word code output unit 15 and a compression data output unit 16.

The character input unit 11 inputs data to be compressed in units of characters according to a given code table. The dictionary storage unit 13 stores a dictionary in which words consisting of one or more characters and word codes corresponding to the words are registered, and the word retrieval unit 12 checks whether an inputted character string is registered in the dictionary.

The character coding unit 14 includes a division unit 17 and a code addition unit 18, and if the input character string is not registered in the dictionary, the character coding unit 14 encodes and outputs the leading character in the character string. The division unit 17 divides a given character code in a predetermined unit, and the code addition unit 18 adds a predetermined additional code to each part generated by the division. If the input character string is registered in the dictionary, the word code output unit 15 outputs a word code corresponding to the input character string.

The compression data output unit 16 arrays codes outputted from both the character coding unit 14 and the word code output unit 15 in order and outputs the codes as a compression result.

Figure 3B:
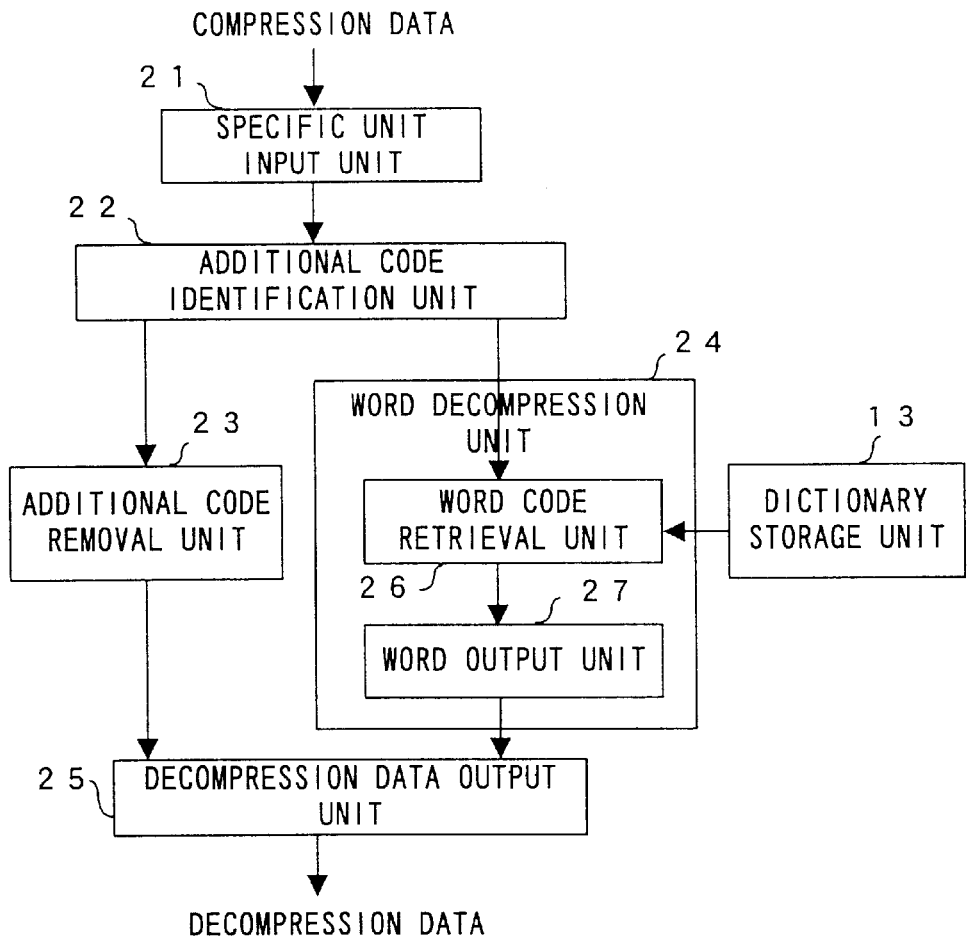
FIG. 3B shows the configuration of the data decompression apparatus.

FIG. 3B shows the configuration of the data decompression apparatus. The data decompression apparatus shown in FIG. 3B comprises a dictionary storage unit 13, a specific unit input unit 21, an additional code identification unit 22, an additional code removal unit 23, a word decompression unit 24 and a decompression data output unit 25.

The specific unit input unit 21 inputs data compressed by the data compression apparatus shown in FIG. 3A in a predetermined unit, and the additional code identification unit 22 judges whether a part of the input data corresponds to an additional code.

If the specific part of the input data corresponds to an additional code, the additional code removal unit 23 removes the additional code from the input data and outputs the remaining data. The word decompression unit 24 includes a word code retrieval unit 26 and a word output unit 27, and if the specific part of the input data does not correspond to an additional code, the word decompression unit 24 regards the input data as a word code and restores the word code to a word. The word code retrieval unit 26 collates the input data with a word code of the dictionary stored in the dictionary storage unit 13 and retrieves a word corresponding to the input data. The word output unit 27 outputs the retrieved word.

The decompression data output unit 25 arrays data outputted from both the additional code removal unit 23 and word decompression unit 24 in order and outputs the data as decompression data. In this way, the data compression/decompression apparatus stores the same dictionary for both compression and decompression, compresses a word according to the dictionary and simultaneously restores a word code to a word.

For example, if it is assumed that data to be compressed are generated using the code table of SJIS codes, that the size of a word code after compression is two bytes, that data are divided in units of one byte and that an additional code is "0xFF", the following compression process is executed.

If an inputted word is not stored in the dictionary, the leading two-byte character "0xijkm" of the word is divided into "0xij" and "0xkm" in units of one byte, an additional code "0xFF" is added to each of them to generate two-byte codes "0xFFij" and "0xFFkm". However, for a character of one byte "0xpq", such as a control code and a half-size character, an additional code "0xFF" is added to the character and "0xFFpq" is outputted. Here, i, j, k, m, p and q represent a value of 0x0 through 0xF.

FIG. 4 shows a code space in the case where such an additional code is used. Here, an area with a higher-order byte that is 0x00 through 0xFE, is assigned to registration words as word codes, and an area with a higher-order byte that is 0xFF is used as the code of an unregistered character generated by using an additional code.

Figure 1C:
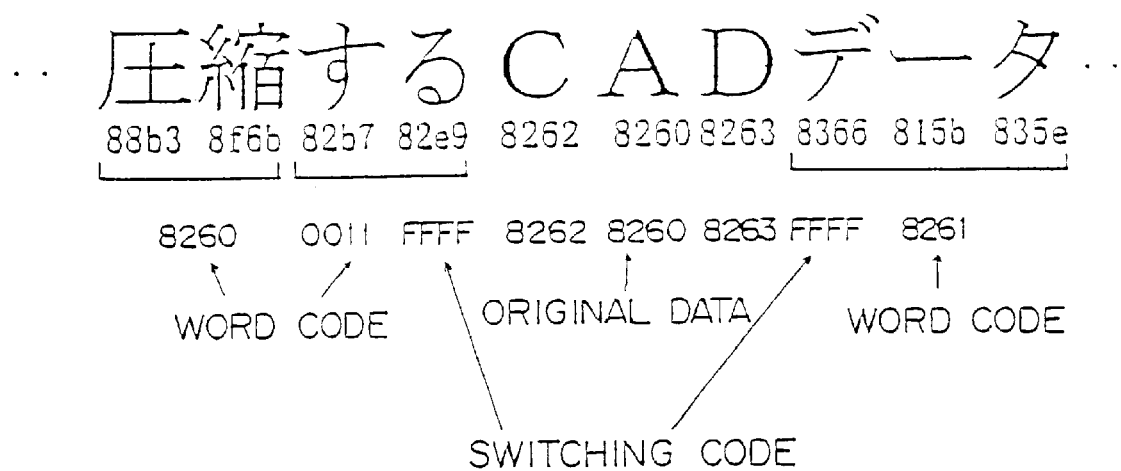
FIG. 1C is an example of a switching code according to the prior art.
Figure 5:
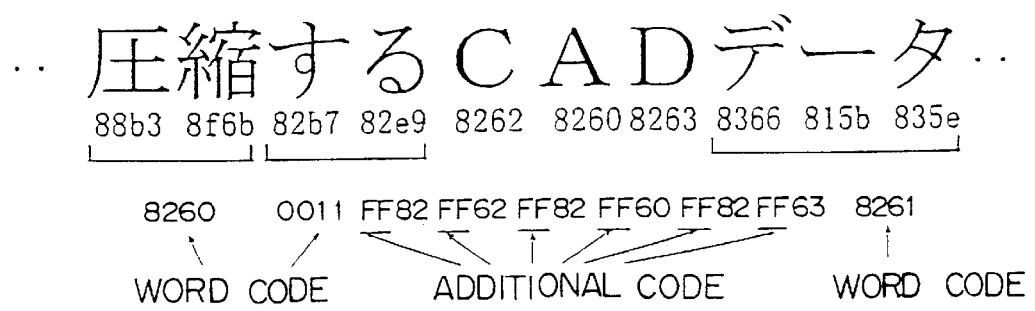
FIG. 5 shows how to encode using an additional code.

By such a compression process, the code of the input character string "圧縮するCADデータ" shown in FIG. 1C is converted to the codes shown in FIG. 5. Here, "圧縮", "する" and "データ" are converted to the same respective word codes as shown in FIG. 1C, as registration words.

However, since words beginning with "C", "A" and "D" are not registered in the dictionary, these characters are handled as the leading character of words not registered (unregistered characters). Each of the codes of these characters, "0x8262", "0x8260" and "0x8263" is divided in units of one byte, and an additional code "0xFF" is added before each obtained part.

For example, a code "0x8262" corresponding to "C" is divided into two parts of "0x82" and "0x62", "0xFF" is added to each part to convert the code "0x8262" to "0xFF82" and "0xFF62". The same applies to "A" and "D".

However, if the higher-order byte of input data of two bytes is 0xFF in a decompression process, the lower-order byte excluding 0xFF is outputted. If the higher-order byte is not 0xFF, it is judged that the input data represents a word code, and a word corresponding to the word code is outputted according to the dictionary.

In the case of the compression data "0x82600011FF82FF62FF82FF 60FF82FF638261" shown in FIG. 5, each of word codes, "0x8260", "0x0011" and "0x8261" is converted to the respective original code according to the dictionary.

However, the higher-order bytes of codes "0xFF82", "0xFF62", "0xFF82", "0xFF60", "0xFF82" and "0xFF63" corresponding to "CAD" all are "0xFF", which corresponds to an additional code. Therefore, these codes are converted to codes of one byte "0x82", "0x62", "0x82", "0x60", "0x82" and "0x63", respectively. Then, two-byte codes are generated from two consecutive one-byte codes to output "0x8262", "0x8260" and "0x8263" corresponding to the original code.

By the way, although each word of "圧縮", "する" and "データ" is converted to the respective word code which is shorter than the original code in the example shown in FIG. 5, "CAD " is converted to a code longer than the original code. Therefore, it might seem that a high compression rate is not always obtained.

However, in a compression process, generally speaking, codes shorter than the original codes as a whole can be generated by assigning a short code to frequently appearing information and by assigning a long code to infrequently appearing information. In this example, although the length of the code of an unregistered code doubles, the length of the code of a registration word is reduced to half or less than half. Therefore, the length of the compression data can be reduced to half or less as a whole by registering many frequently appearing words.

Figure 6:
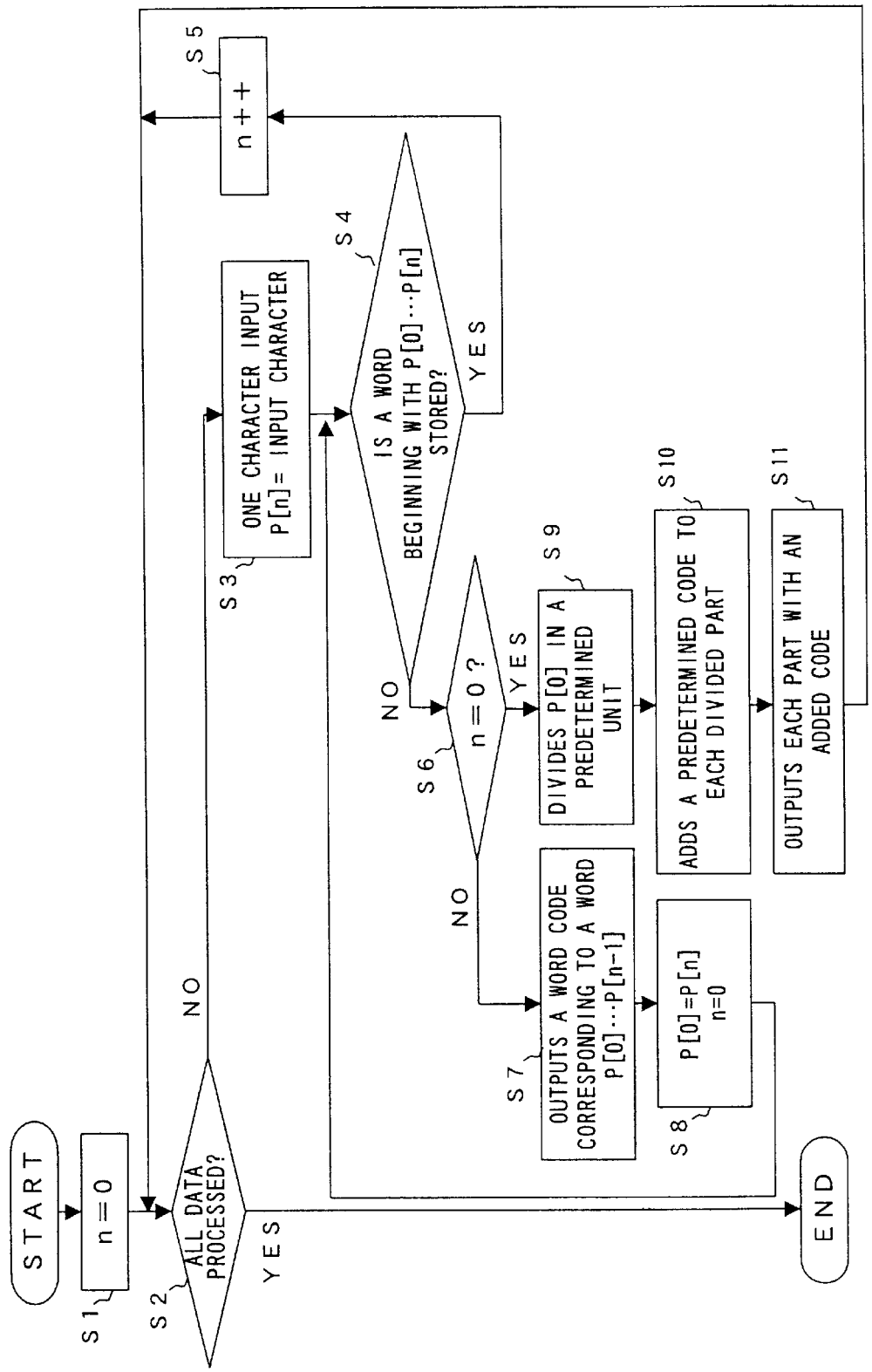
FIG. 6 is a flowchart showing the compression process.

FIG. 6 is a flowchart showing the compression process of the data compression apparatus shown in FIG. 3A. First, the character input unit 11 sets control variable n to 0 (step S1) and judges whether all input data are processed (step S2). If unprocessed input data remain, the character input unit inputs a code of one character and inputs the code of the inputted character to a buffer P[n] (step S3). Then, the word retrieval unit 12 checks whether a word beginning with a character string P[0]P[1]... P[n] is registered in a dictionary (step S4).

If such a word is registered in the dictionary, the word retrieval unit 12 adds 1 to n (step S5), and repeats processes in steps S2 and after. If in step S4, a word beginning with a character string P[0]P[1]... P[n] is not registered in the dictionary, the word retrieval unit 12 judges whether n=0 is satisfied (step S6).

If n=0 is not satisfied, a character string P[0]P[1]... P[n−1] obtained by subtracting P[n] from the character string P[0]P[1]... P[n] is registered in the dictionary as a word. Therefore, the word retrieval unit 12 extracts a word code corresponding to the word from the dictionary and passes the word code to the word code output unit 15 (step S7). When receiving the word code, the word code output unit 15 outputs the word code as a conversion result, and the compression data output unit 16 outputs the word code as compression data. Then, the character input unit 11 sets P[0]=P[n] and n=0 (step S8) and repeats processes in steps S4 and after.

If in step S6, n=0 is satisfied, a word beginning with P[n] (=P[0]) is not registered in the dictionary. Therefore, the division unit 17 divides P[0] in a predetermined unit (step S9), and the code addition unit 18 adds an additional code to each divided part (step S10) and outputs the divided parts (step S11). Then, the compression data output unit 16 outputs the codes with an additional code as compression data, and the character input unit 11 repeats processes in steps S2 and after.

When in step S2, all input data are processed, the data compression process terminates the compression process.

For example, in the case of the input character string shown in FIG. 5, if the first character "圧" is inputted, P[0]="0x88b3" is satisfied (step S3). At this time, since a word "圧縮" beginning with "圧" is registered in the dictionary, the next character "縮" is inputted to satisfy P[1]="0x8f6b" (step S3). Then, "す" is inputted to satisfy P[2]="0x82b7" (step S3).

Since a word beginning with "圧縮す" is not registered in the dictionary and n=2≠0 is satisfied, the word code "0x8260" of a word "圧縮" corresponding to P[0]P[1] is outputted (step S7). Then, P[0]=P[2]="0x82b7" and n=0 are satisfied (step S8).

At this time, since a word "する" beginning with "す" is registered in the dictionary, the next character "る" is inputted to satisfy P[1]="0x82e9" (step S3) and "C" is inputted to satisfy P[2]="0x8262" (step S3).

Here, since a word beginning with "するC" is not registered in the dictionary and n=2≠0 is satisfied, the word code "0x0011" of a word "する" corresponding to P[0]P[1] is outputted (step S7). Then, P[0]=P[2]="0x8262" and n=0 are satisfied (step S8).

At this time, since a word beginning with "C" is not registered in the dictionary and n=0 is satisfied, P[0]= "0x8262" is divided into two parts "0x82" and "0x62" (step S9), an additional code "0xFF" is added to each of the divided parts (step S10) to output "0xFF82" and "0xFF62" (step S11).

Likewise, if a character "A" is inputted, "0xFF82" and "0xFF60" are outputted (step S11), and if a character "D" is inputted, "0xFF82" and "0xFF63" are outputted (step S11).

Then, if a character "デ" is inputted, P[0]="0x8366" is satisfied (step S3). At this time, since a word "データ" beginning with "デ" is registered in the dictionary, the next character "ー" is inputted to satisfy P[1]="0x815b" (step S3) and "タ" is inputted to satisfy P[2]="0x835e" (step S3).

Then, it is assumed that the next character, which is not shown in FIG. 6, is inputted and is set to P[3] and that a word beginning with P[0]P[1]P[2]P[3] is not registered. At this time, since n=3≠0 is satisfied, the word code "0x8261" of a word "データ" corresponding to P[0]P[1]P[2] is outputted (step S7).

Figure 7:
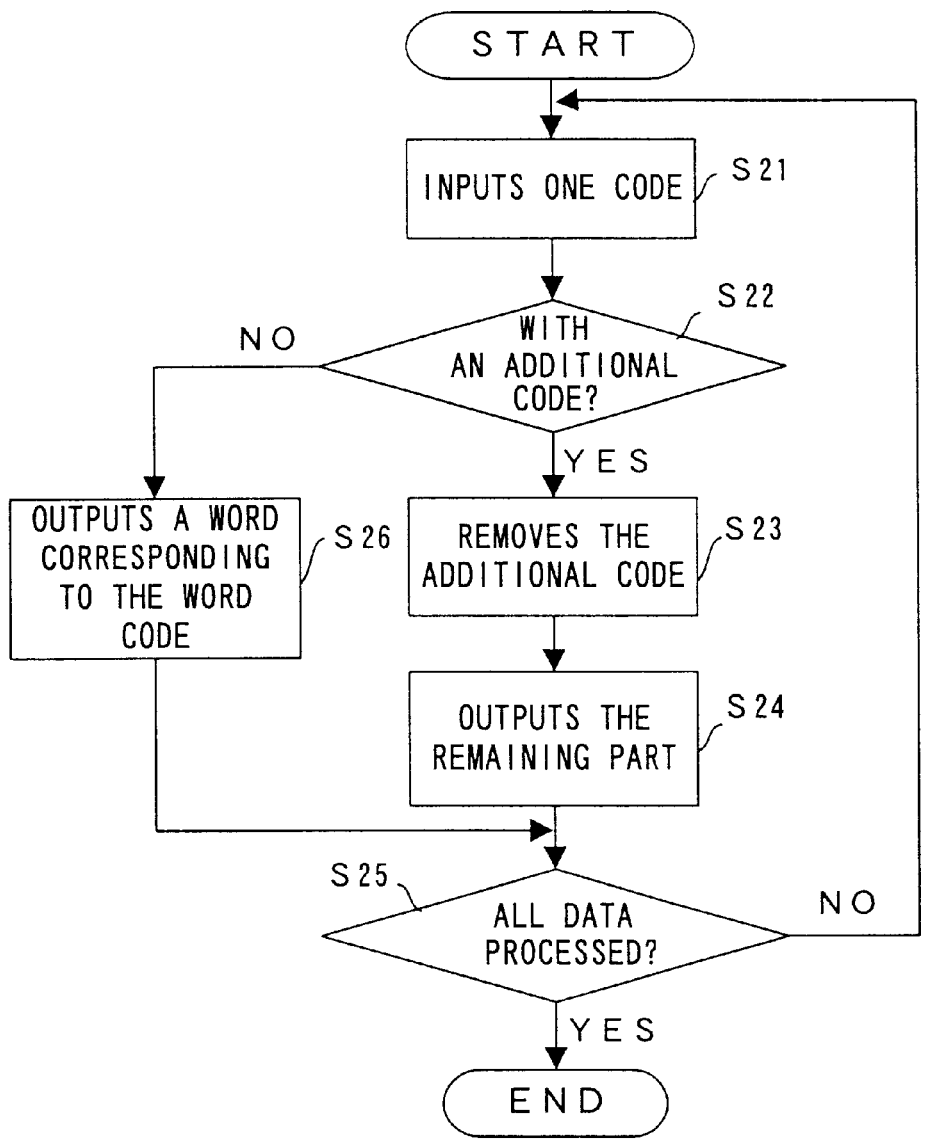
FIG. 7 is a flowchart showing the decompression process.

FIG. 7 is a flowchart showing the decompression process of the data decompression apparatus shown in FIG. 3B. First, the specific unit input unit 21 inputs one code from input data (step S21), and the additional code identification unit 22 judges whether an additional code is added to the code (step S22).

If an additional code is added to the input code, the additional code removal unit 23 removes the additional code from the input code (step S23), and the decompression data output unit 25 outputs the remaining part as decompression data (step S24). The specific unit input unit 21 judges whether all input data are processed (step S25). If unprocessed data remain, the specific unit input unit 21 repeats processes in steps S21 and after.

In step S22, if an additional code is not added to the input code, the word retrieval unit 26 regards the input code as a word code and retrieves a dictionary, and the word output unit 27 outputs a code of the corresponding word (step S26). Then, the decompression data output unit 25 outputs the code of the word as decompression data, and the specific unit input unit 21 repeats processes in steps S25 and after.

Then, when all input data are processed in step S25, the data decompression apparatus terminates the decompression process.

For example, in the case of the compression data shown in FIG. 5, since an additional code is not added to the first two codes "0x8260" and "0x0011", these are recognized as word codes. As a result, "0x8260" is converted to "0x88b38f6b" (step S26), and "0x0011" is converted to "0x82b782e9" (step S26). The obtained codes correspond to two words "圧縮" and "する", respectively.

Since an additional code "0xFF" is added to the next six codes "0xFF82", "0xFF62", "0xFF82", "0xFF60", "0xFF82" and "0xFF63", this additional code is removed from the six codes to output "0x826282608263" (step S24). The outputted codes correspond to "CAD".

An additional code is not added to the next code "0x8261". This code is recognized as a word code and is converted to "0x8366815b835e" (step S26). The obtained code corresponds to a word "データ".

Next, a process to decompress compression data in mid-course is described with reference to FIGS. 8 through 12.

Figure 8:
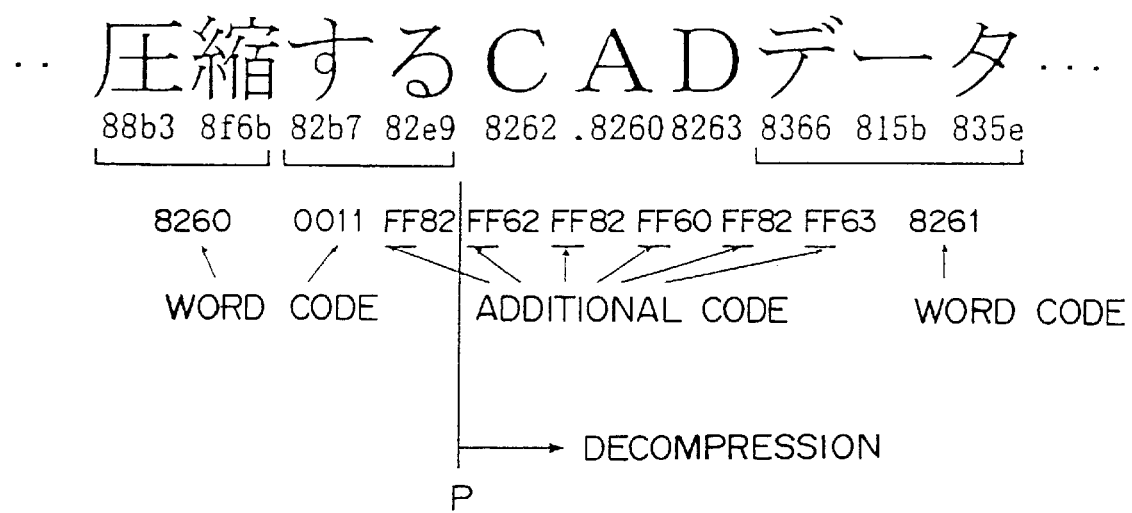
FIG. 8 shows a decompression start position.

When compression data are decompressed in mid-course, a meaningful result often cannot be obtained even by faithfully decompressing the compression data if an additional code is included in a leading two-byte code located in the decompression start position. For example, when the compression data shown in FIG. 5 are decompressed in mid-course position P as shown in FIG. 8, a leading two-byte code "0xFF62" represents one character "C" in combination with a two-byte code "0xFF82" immediately before "0xFF62", and one-byte code "0x62" obtained by subtracting an additional code from "0xFF62" alone does not represent a character.

Therefore, when compression data are decompressed in mid-course, there are two decompression methods: a method in which decompression is not carried out until the first word code appears and a method for identifying a break between character codes and removing a leading decompression code not representing a character.

Figure 9:
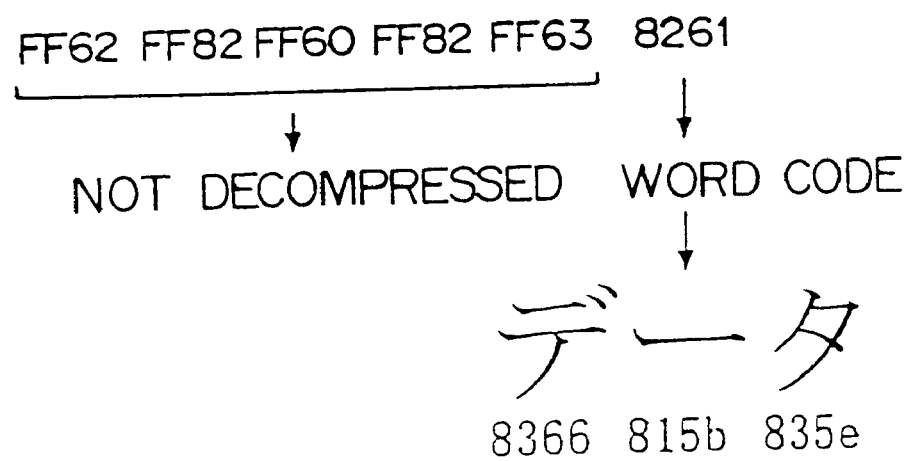
FIG. 9 shows the first process to decompress in the mid-course.

According to the former method, as shown in FIG. 9, five codes "0xFF62", "0xFF82", "0xFF60", "0xFF82" and "0xFF63" immediately before the first word code "0x8261" are not decompressed and skipped, and "0x8261" and subsequent codes are restored to the original data.

Figure 10:
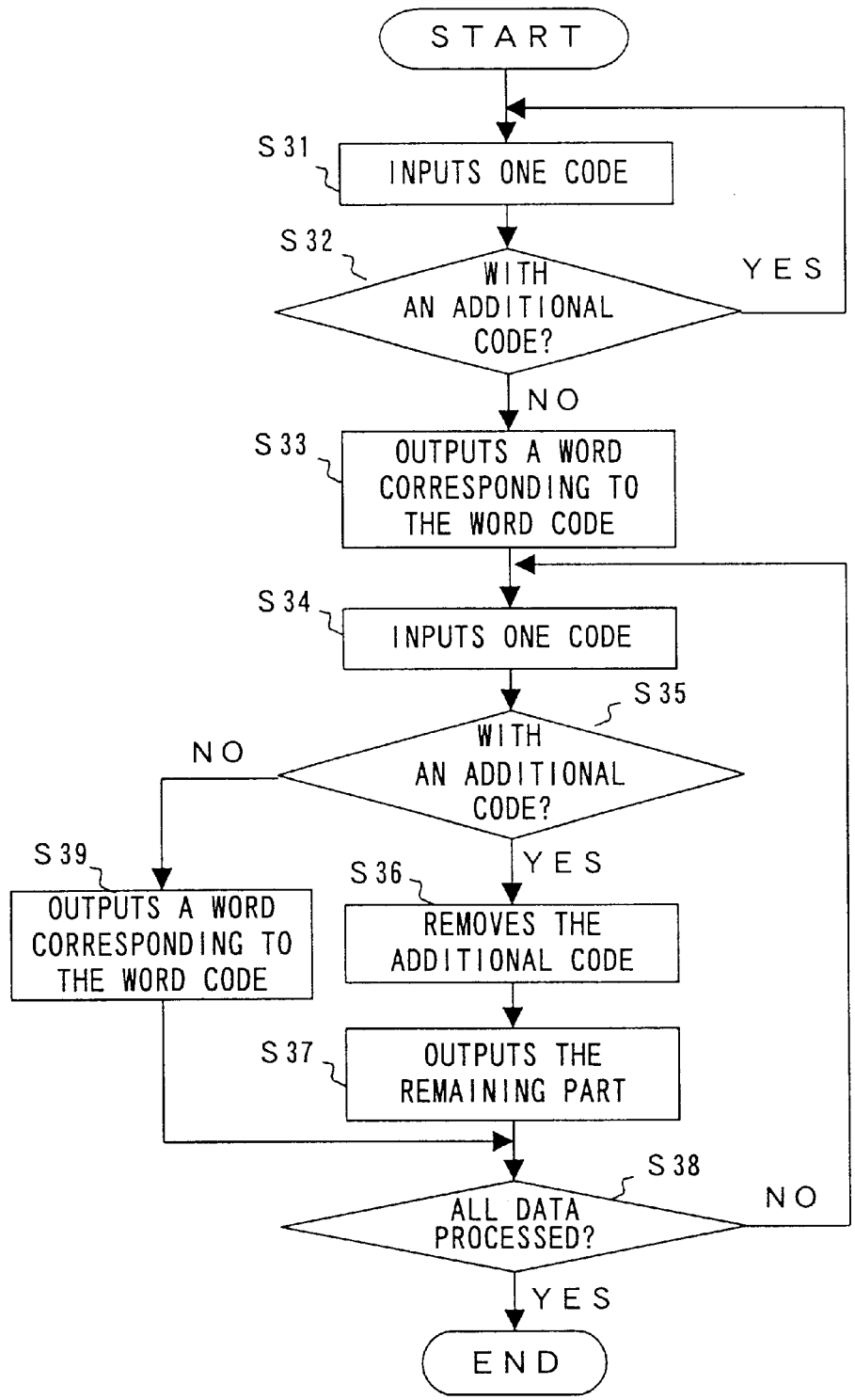
FIG. 10 is a flowchart showing the first process.

FIG. 10 is a flowchart showing such a decompression process. First, the specific unit input unit 21 inputs one code from input data (step S31), and the additional code identification unit 22 judges whether an additional code is added to the input code (step S32). If an additional code is added to the input code, the specific unit input unit 21 repeats processes in steps S31 and after.

If in step S32, an additional code is not added to the input code, the word retrieval unit 26 regards the input code as a word code and retrieves a dictionary, and the word output unit 27 outputs codes of the corresponding word (step S33). Then, the decompression data output unit 25 outputs the codes of the word as decompression data. Then, the data decompression apparatus carries out the same decompression process as shown in FIG. 7 in steps S34, S35, S36, S37, S38 and S39.

Figure 11:
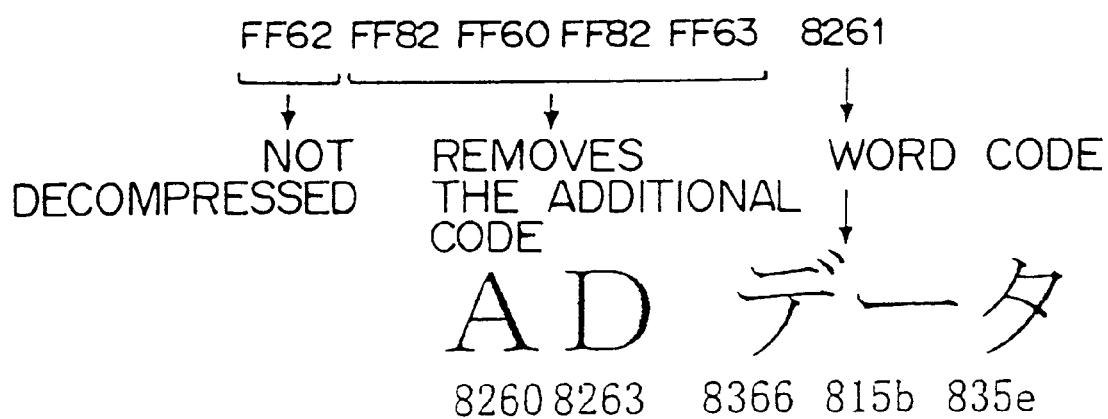
FIG. 11 shows the second process to decompress in the mid-course.

According to the latter method, as shown in FIG. 11, a leading code "0xFF62" representing no character is not decompressed and skipped, and the next "0xFF82" and subsequent codes are decompressed.

FIG. 12 is a flowchart showing such a decompression process. First, the specific unit input unit 21 prepares a buffer stk[] for identifying a character break, sets control variable n to 0 (step S41) and inputs one code from input data (step S42).

Then, the additional code identification unit 22 judges whether an additional code is added to an input code (step S43). If an additional code is added to the input code, the additional code removal unit 23 removes the additional code from the input code (step S44) and inputs the remaining part to stk[n] (step S45). Then, the specific unit input unit 21 adds 1 to n (step S46) and repeats processes in steps S42 and after.

If in step S43, an additional code is not added to the input code, the additional code removal unit 23 judges whether the code in stk[0] matches a break between character codes (step S47). If the code matches the break between character codes, the additional code removal unit 23 outputs codes in stk[0], stk[1], . . . , stk[n] in that order (step S48). If the code does not match the break between character codes, the additional code removal unit 23 outputs codes in stk[1], . . . , stk[n] with the exception of stk[0], in that order (step S49).

Then, the word code retrieval unit 26 regards the input code as a word code and retrieves a dictionary, and the word output unit 27 outputs codes of the corresponding word (step S50). Then, the decompression data output unit 25 outputs the codes of the word as decompression data. Then, the data decompression apparatus executes the same decompression process as shown in FIG. 7 in steps S51, S52, S53, S54, S55 and S56.

According to such a compression process using additional data, since the length of codes included in compression data are all the same and each code represents a specific word or character in a one-to-one correspondence, this process can be used as the pre-treatment of another compression process. If compression data is compressed by another compression process again, a code of a length corresponding to the appearance frequency of each word can be assigned, thereby enabling the improvement of a compression rate. In this case, it is preferable to compress data in units of word code sizes.

For another compression process, an arbitrary coding, such as Huffman code, canonical Huffman code, splay code, arithmetic code, ppm (prediction by partial match), LZ77 code, LZ78 code, etc., can be used.

Figure 13:
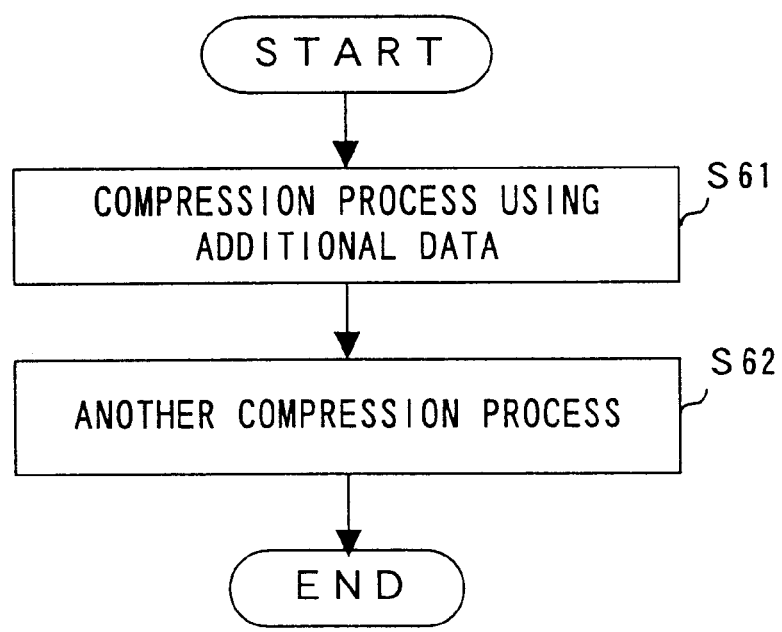
FIG. 13 is a flowchart showing the complex compression process.

FIG. 13 is a flowchart showing the complex compression process using a compression process using an additional code for the pre-treatment of another compression process. In this process, the data compression apparatus first executes a compression process using additional data for input data (step S61), then executes another compression process (step S62) and generates compression data.

Figure 14:
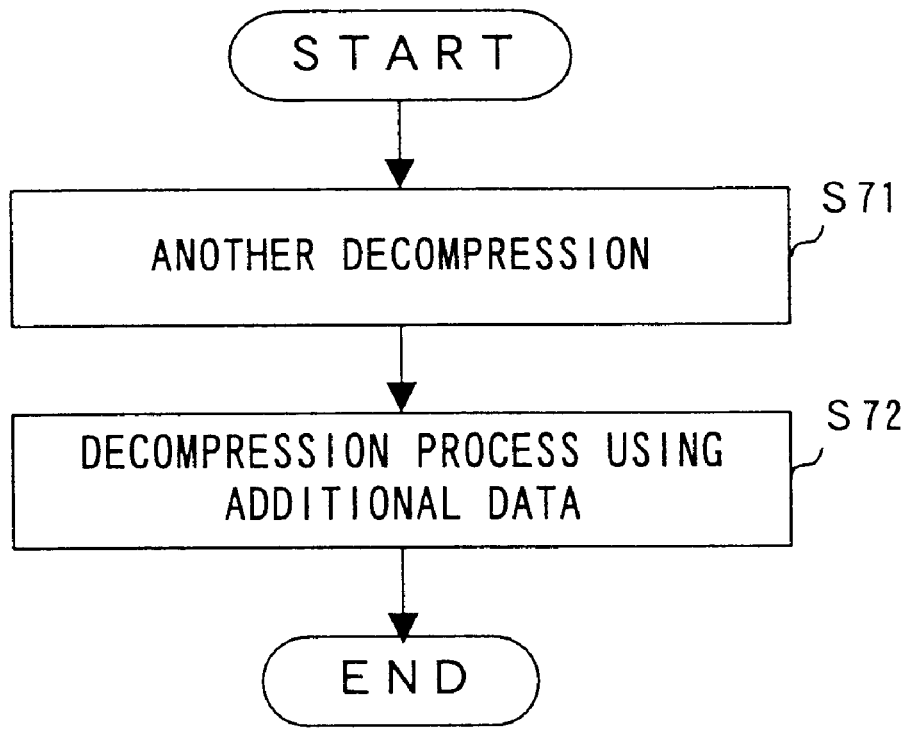
FIG. 14 is a flowchart showing the complex decompression process.

FIG. 14 is a flowchart showing the complex decompression process to decompress compression data generated in this way. In this process, the data decompression apparatus first executes another decompression process in combination with the compression process in step S62, for input data (step S71), then executes a decompression process using additional data (step S72) and generates decompression data.

Furthermore, the compression process in this preferred embodiment can be used for data retrieval. The data retrieval is usually carried out in a form of uncompressed original data. However, if a character string, etc., is retrieved in compression data, the amount of data to be retrieved is reduced and the retrieval speed can be improved compared with a case where retrieval is carried out without compression. In particular, according to the compression process in this preferred embodiment, since the length of codes included in compression data all are the same and each code represents one specific word or character in a one-to-one correspondence, the retrieval in the compression data can be carried out at high speed.

Figure 16:
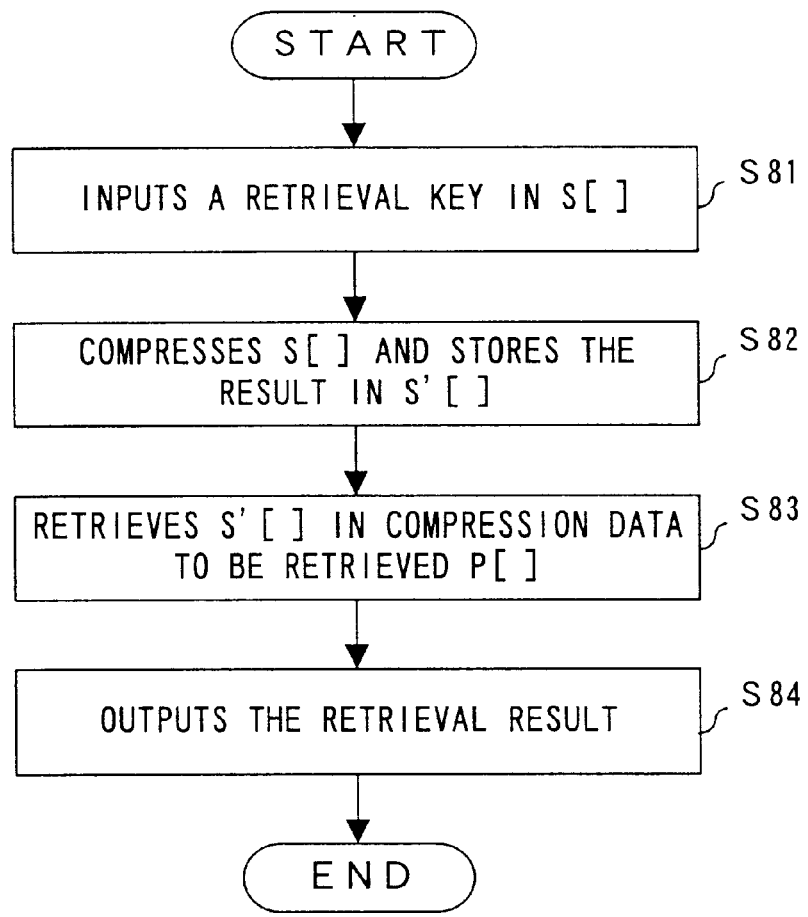
FIG. 16 is a flowchart showing the retrieval process.

FIG. 15 shows the configuration of the retrieval apparatus executing such a retrieval process. The retrieval apparatus shown in FIG. 15 comprises a retrieval key input unit 31, a data compression apparatus 32, a compressed string retrieval unit 33, a retrieval result output unit 34 and a database 35, and executes the process as shown in FIG. 16.

First, the retrieval key input unit 31 inputs a retrieval key (query) designated by a user or system to a buffer S[ ] (step S81), and the data compression apparatus 32 generates a compression retrieval key by compressing the retrieval key and stores the retrieval key in a buffer S'[ ] (step S82).

Although it is preferable to use the data compression apparatus shown in FIG. 3A for data compression apparatus 32, a data compression apparatus based on another static coding method can also be used. The database 35 stores data to be retrieved compressed by the same compression method as that of the data compression apparatus 32.

The compressed string retrieval unit 33 stores compression data extracted from the database in a buffer P[ ], and retrieves the compression retrieval key in S'[ ] in the buffer P[ ] (step S83). Then, the retrieval result output unit 34 outputs the retrieval result and terminates the process (step S84).

Although in the above-described preferred embodiments, a case where document data are compressed has been described, the present invention can be applied to not only document data but also arbitrary data including CAD data and program codes. The bit size of codes to be applied is not limited to two bytes, and three bytes, four bytes or a mixture of one or more bit sizes can also be used. In all cases, words/characters registered in a dictionary are converted to word codes, a character included in an unregistered word is divided in a specific unit and an additional code is added to each divided part.

The above-described additional code can be added in an arbitrary position of a code outputted as compression data. For example, in the compression data shown in FIG. 5, the code of a character "C" can be divided into two parts of "0x82" and "0x62", and an additional code "0xFF" can also be added after each part to generate codes, such as "0x82FF" and "0x62FF". For the additional code, an arbitrary code can be used besides "0xFF".

In this case, an arbitrary bit size can be used for the division unit of a character code, and the number of division is also arbitrary. For example, a character code of two bytes (16 bits) can also be divided into four four-bit codes and an additional code of 12 bits can also be added to each part.

Figure 17:
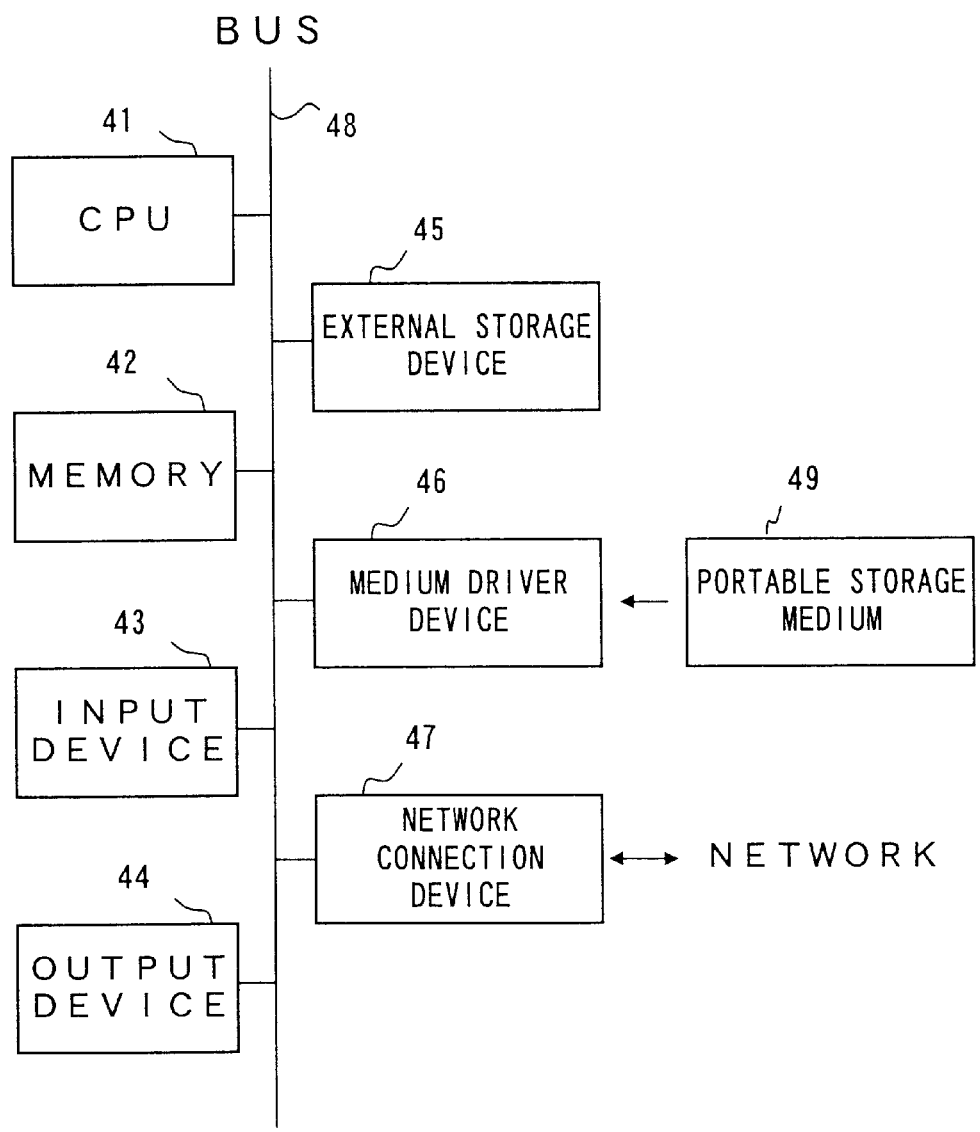
FIG. 17 shows the configuration of the information processing device.

The data compression apparatus shown in FIG. 3A, data decompression apparatus shown in FIG. 3B and retrieval apparatus shown in FIG. 15 can be configured, for example, using an information processing device (computer) shown in FIG. 17. The information processing device shown in FIG. 17 comprises a CPU (central processing unit) 41, a memory 42, an input device 43, an output device 44, an external storage device 45, a medium driver device 46 and a network connection device 47, which all are connected with using a bus 84.

The memory 42, for example, includes a ROM (read only memory), RAM (random access memory), etc., and stores a program and data to be used for the process. The CPU 41 executes necessary processes by using the memory 42 and running the program.

The character input unit 11, word retrieval unit 12, character coding unit 14, word code output unit 15 and compression data output unit 16 shown in FIG. 3A, the specific unit input unit 21, additional code identification unit 22, additional code removal unit 23, word decompression unit 24 and decompression data output unit 25 shown in FIG. 3B, the retrieval key input unit 31, compressed string retrieval unit 33 and retrieval result output unit 34, for example, are stored in the specific program code segment of the memory 42 as a software component described using a program. The memory 42 can also be used as the dictionary storage unit 13 shown in FIGS. 3A and 3B.

The input device 43, for example, is a keyboard, pointing device, touch panel, etc., and is used for a user to input instructions and information. The output device 44, for example, is a display, printer, etc., and is used to make inquiries of a user, to output process results, etc.

The external storage device 45, for example, is a magnetic disk device, optical disk device, magneto-optical disk device, etc. This external storage device 45 stores the above-described program and data, which can be used by loading them to the memory 42, as required. The external storage device 45 can also be used for the database 35 shown in FIG. 15.

The medium driver device 46 drives a portable storage medium 49 to access the recorded content. For the portable storage medium 49, an arbitrary computer-readable storage medium, such as a memory card, floppy disk, CD-ROM (compact disk read only memory), optical disk, magneto-optical disk, etc., can be used. This portable storage medium 49 stores the above-described program and data, which can also be used by loading them to the memory 42.

The network connection device 47 communicates with external apparatuses via an arbitrary network (line), such as a LAN (local area network), etc., and transmits/receives data accompanying communications. The network connection device 47 can also receive the above-described program and data from an external device, from which the program and data can be loaded to the memory 42, as required.

Figure 18:
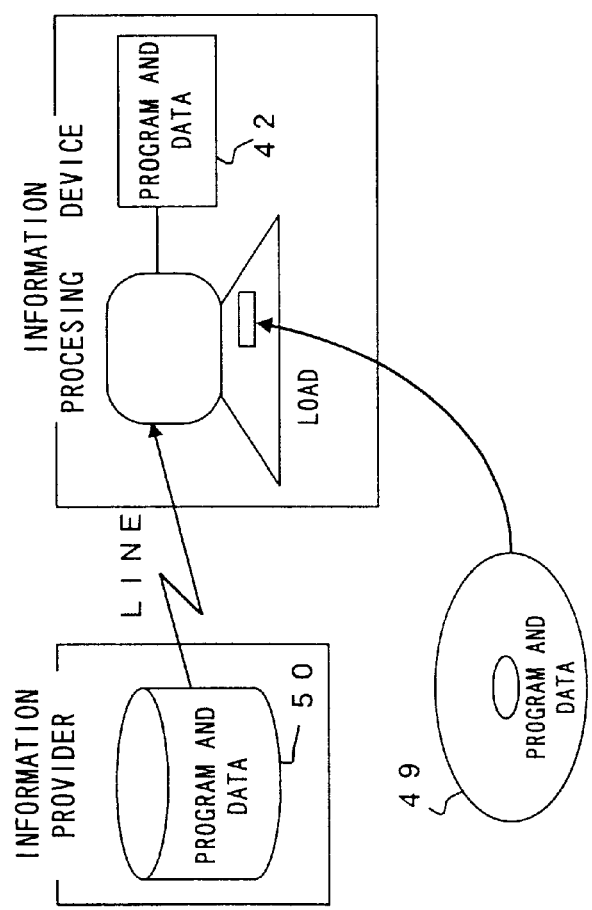
FIG. 18 shows the storage media.

FIG. 18 shows computer-readable portable storage media for supplying the information processing device shown in FIG. 17, with a program and data. The program and data stored in the portable storage medium 49 or the external database 50 are loaded to the memory 42. Then, the CPU executes necessary processes by running the program and using the data.

According to the present invention, any data generated from any kind of code table can be compressed at a high compression rate and can be decompressed from any position of compression data.

Since the length of codes included in obtained compression data are all the same and each code presents one specific word or character, this process can also be used for the pre-treatment of another compression process and can be used for a retrieval process without decompression.

What is claimed is:

1. A data compression apparatus, comprising:
a character input unit inputting data in units of characters;
a dictionary unit storing a character string consisting of one or more characters and a registration code corresponding to the character string;
a registration code generation unit outputting a registration code corresponding to an input character string as compression data of the input character string when the input character string is stored in the dictionary unit;
a coding unit generating a new code consisting of an additional code and an input character by adding the additional code to the input character and outputting the new code as compression data of the input character when a character string beginning with the input character is not stored in the dictionary unit;
a retrieval unit checking whether the character string beginning with the input character is stored in said dictionary unit;
a division unit dividing a character code of the input character into a plurality of parts in a predetermined unit; and
an addition unit generating respective new codes for respective parts of the character code by adding the additional code to each of the respective parts.

2. The data compression apparatus according to claim 1, wherein said coding unit generates a new code with a size that matches a size of the registration code.

3. The data compression apparatus according to claim 2, wherein
said dictionary unit stores a registration code of two bytes;
said division unit divides the input character into a plurality of parts in units of one byte; and
said addition unit generates a new code of two bytes by adding an additional code of one byte to each obtained part.

4. The data compression apparatus according to claim 1, further comprising a compression unit further compressing the compression data.

5. A data compression apparatus, comprising:
a character input unit inputting data in units of characters;
a dictionary unit storing a character string consisting of one or more characters and a registration code corresponding to the character string;
a registration code generation unit outputting a registration code corresponding to an input character string as compression data of the input character string if the input character string is stored in the dictionary unit; and
a coding unit generating respective new codes for respective parts of a character code of an input character in the input character string, each of the new codes consisting of an additional code and one of the respective parts, by dividing the character code of the input character into the respective parts and by adding the additional code to each of the respective parts if a character string beginning with the input character is not stored in the dictionary unit, and outputting the new codes as compression data of the input character.

6. A data decompression apparatus, comprising:
a unit input unit inputting data in units of two bytes;
a dictionary unit storing a character string consisting of at least one character and a registration code corresponding to the character string;
an identification unit judging whether input data is a code consisting of a predetermined additional code of one byte and a character;
a removal unit generating data of one byte by removing the predetermined additional code from the input data and outputting the generated data as decompression data of the character in the input data when the input data is the code consisting of the additional code and the character; and
a character string decompression unit regarding the input data as a registration code and outputting a character string corresponding to the input data as decompression data of the input data when the input data is not the code consisting of the additional code and the character.

7. The data decompression apparatus according to claim 6, wherein when decompression is performed in the middle of compression data, said identification unit skips data including an additional code and does not hand the data including the additional code to said removal unit until the first data without an additional code are inputted.

8. The data decompression apparatus according to claims 6, wherein when decompression is performed in the middle of compression data, said identification unit skips data including an additional code and does not hand the data including the additional code to said removal unit if a meaningful code is not obtained by removing the additional code from the input data.

9. The data decompression apparatus according to claim 8, wherein said identification unit keeps data from the input data in a decompression start position, judges whether the kept data generate a meaningful code and determines whether to hand the kept data to said removal unit.

10. A retrieval apparatus, comprising:
an input unit inputting a retrieval key;
a compression unit compressing the inputted retrieval key by a compression method to generate a compressed retrieval key, including
a character input unit inputting data of the retrieval key in units of character;
a dictionary unit storing a character string consisting of at least one character and a registration code corresponding to the character string;
a registration code generation unit outputting a registration code corresponding to an input character string of the retrieval key as compression data of the input character string if the input character string is stored in the dictionary unit; and
a coding unit generating respective new codes for respective parts of a character code of an input character in the input character string, each of the new codes consisting of an additional code and one of the respective parts, by dividing the character code of the input character into the respective parts and by adding the additional code to each of the respective parts if a character string beginning with the input character is not stored in the dictionary unit, and outputting the new codes as compression data of the input character;

a retrieval unit retrieving the compressed retrieval key in compression data compressed by the compression method; and an output unit outputting a retrieval result.

11. A computer-readable storage medium on which is recorded a program enabling a computer to perform a process, said process comprising:

inputting data in units of characters;

outputting a registration code corresponding to an input character string as compression data of the input character string if the input character string is registered in a dictionary;

generating a new code consisting of an additional code and an input character by adding the additional code to the input character if a character string beginning with the input character is not registered in the dictionary;

a retrieval unit checking whether the character string beginning with the input character is stored in said dictionary unit;

a division unit dividing a character code of the input character into a plurality of parts in a predetermined unit; and an addition unit generating respective new codes for respective parts of the character code by adding the additional code to each of the respective parts.

12. A computer-readable storage medium on which is recorded a program enabling a computer to perform a process, said process comprising:

inputting data in unit units of two bytes;

generating data of one byte by removing a predetermined additional code of one byte from input data and outputting the generated data as decompression data of the character in the input data if the input data is a code consisting of the predetermined additional code and a character; and regarding the input data as a registration code and outputting a character string registered in a dictionary corresponding to the input data as decompression data of the input data if the input data is not the code consisting of the predetermined additional code and the character.

13. A data compression method, comprising:

inputting data in units of characters;

outputting a registration code corresponding to an input character string as compression data of the input character string if the input character string is registered in a dictionary;

generating a new code consisting of an additional code and an input character by adding the additional code to the input character in the input character string and outputting the new code as compression data of the input character string if a character string beginning with the input character is not registered in the dictionary;

checking whether the character string beginning with the input character is stored in said dictionary unit;

dividing a character code of the input character into a plurality of parts in a predetermined unit, and generating respective new codes for respective parts of the character code by adding the additional code to each of the respective parts.

14. A data decompression method, comprising:

inputting data in units of two bytes;

generating data of one byte by removing a predetermined additional code of one byte from input data and outputting the generated data as decompression data of the character in the input data if the input data is a code consisting of the predetermined additional code and a character; and regarding the input data as a registration code and outputting a character string registered in a dictionary corresponding to the input data as decompression data of the input data if the input data is not the code consisting of the predetermined additional code and the character.

15. A data compression apparatus, comprising:

character input means for inputting data in units of characters;

dictionary means for storing a character string consisting of one or more characters and a registration code corresponding to the character string;

registration code generation means for outputting a registration code corresponding to an input character string as compression data of the input character string when the input character string is stored in the dictionary means;

coding means for generating a new code consisting of an additional code and an input character by adding the additional code to the input character in the input character string and outputting the new code as compression data of the input character string when a character string beginning with the input character is not stored in the dictionary means;

retrieval means for checking whether the character string beginning with the input character is stored in said dictionary unit;

division means for dividing a character code of the input character into a plurality of parts in a predetermined unit; and addition means for generating respective new codes for respective parts of the character code by adding the additional code to each of the respective parts.

16. A data decompression apparatus, comprising:

unit input means for inputting data in units of two bytes;

dictionary means for storing a character string consisting of one or more characters and a registration code corresponding to the character string;

identification means for judging whether input data is a code consisting of a predetermined additional code of one byte and a character;

removal means for generating data of one byte by removing the additional code from the input data and outputting the generated data as decompression data of the character in the input data when the input data is a code consisting of the predetermined additional code and a character; and character string decompression means for regarding the input data as a registration code and outputting a character string corresponding to the input data as decompression data of the character in the input data when the input data is not the code consisting of the additional code and the character.

* * * * *

UNITED STATES PATENT AND TRADEMARK OFFICE
CERTIFICATE OF CORRECTION

PATENT NO.   : 6,834,283 B1
DATED        : December 21, 2004
INVENTOR(S)  : Noriko Satoh It is certified that error appears in the above-identified patent and that said Letters Patent is hereby corrected as shown below:

Title page,
Item [75], Inventor, change "Kanagawa" to -- Kawasaki-shi --.

Column 14,
Line 39, replace "claims" with -- claim --.

Column 15,
Line 25, remove "a retrieval unit" before "checking";
Line 27, remove "unit" after "dictionary";
Line 28, remove "a division unit" before "dividing";
Line 31, remove "an addition unit" before "generating";
Line 37, remove "unit" before "units";
Line 64, remove "unit" after "dictionary";
Line 66, replace "," (comma) with -- ; -- (semicolon) after "unit".

Column 16,
Line 38, replace "unit" with -- means --.

Signed and Sealed this

Twenty-sixth Day of July, 2005

JON W. DUDAS
*Director of the United States Patent and Trademark Office*